(12) United States Patent
Rusinko, Jr. et al.

(10) Patent No.: US 7,929,269 B2
(45) Date of Patent: Apr. 19, 2011

(54) WAFER PROCESSING APPARATUS HAVING A TUNABLE ELECTRICAL RESISTIVITY

(75) Inventors: David Michael Rusinko, Jr., Parma Heights, OH (US); Marc Schaepkens, Clifton Park, NY (US); Wanxue Zeng, Guilderland Center, NY (US)

(73) Assignee: Momentive Performance Materials Inc., Albany, NY (US)

( * ) Notice: Subject to any disclaimer, the term of this patent is extended or adjusted under 35 U.S.C. 154(b) by 74 days.

(21) Appl. No.: 12/204,079

(22) Filed: Sep. 4, 2008

(65) Prior Publication Data
US 2010/0053841 A1   Mar. 4, 2010

(51) Int. Cl.
H01T 23/00   (2006.01)

(52) U.S. Cl. .......................... 361/234; 361/230

(58) Field of Classification Search .......... 361/230–234
See application file for complete search history.

(56) References Cited

U.S. PATENT DOCUMENTS

| | | |
|---|---|---|
| 4,384,918 A | 5/1983 | Abe |
| 5,663,865 A | 9/1997 | Kawada et al. |
| 5,668,524 A | 9/1997 | Aida et al. |
| 5,702,764 A | 12/1997 | Kimura et al. |
| 5,748,436 A | 5/1998 | Honma et al. |
| 5,777,543 A | 7/1998 | Aida et al. |
| 5,928,960 A | 7/1999 | Greco et al. |
| 6,122,159 A | 9/2000 | Arai et al. |
| 6,351,367 B1 | 2/2002 | Mogi et al. |
| 6,410,172 B1 | 6/2002 | Gilbert, Sr. |
| 6,535,372 B2 | 3/2003 | Parkhe et al. |
| 6,953,918 B2 | 10/2005 | Kano et al. |
| 2004/0011770 A1 | 1/2004 | Strang et al. |
| 2008/0016684 A1* | 1/2008 | Olechnowicz et al. ......... 29/748 |
| 2008/0186647 A1 | 8/2008 | Kawajiri et al. |
| 2009/0242544 A1* | 10/2009 | Kano ......................... 219/444.1 |

FOREIGN PATENT DOCUMENTS

| | | |
|---|---|---|
| EP | 0768389 B1 | 8/2000 |
| EP | 1220311 B1 | 2/2007 |
| JP | 7226431 | 8/1995 |
| JP | 8051001 | 2/1996 |
| JP | 8078202 | 3/1996 |
| JP | 8102485 | 4/1996 |
| JP | 8153603 | 6/1996 |
| JP | 8157263 | 6/1996 |
| JP | 2007109827 A | 4/2007 |
| WO | 99/29030 | 6/1999 |
| WO | 2007058605 A1 | 5/2007 |

* cited by examiner

*Primary Examiner* — Danny Nguyen
(74) *Attorney, Agent, or Firm* — Joseph E. Waters (57) ABSTRACT

An article with an etch resistant coating is disclosed. The article is a heating element, wafer carrier, or electrostatic chuck. The article has a base substrate made of a ceramic or other material, and further has one or more electrodes for resistance heating or electromagnetic chucking or both. The eth resistant coating has a plurality of regions made from materials having different electrical volume resistivities, such that the overall coating has a bulk resistivity that can be tailored by varying the relative size of each region.

22 Claims, 7 Drawing Sheets

WAFER PROCESSING APPARATUS HAVING A TUNABLE ELECTRICAL RESISTIVITY

BACKGROUND

The present embodiments relate generally to devices primarily for use in semiconductor wafer processing equipment having an aluminum nitride coating provided thereon. More particularly, the embodiments relate to heating units, wafer carriers, and electrostatic chucks having a coating applied thereon having a plurality of zones of differing resistivities.

In one application, the wafer processing apparatus is especially useful as an heated electrostatic chuck for applications where a semiconductor wafer needs to be heated from 100-600° C. while it is electrostatically clamped to the surface of the heated chuck. The chucking force is achieved when the resistivity of the layer between the chucking electrode and the wafer falls within a range defined as the Johnson-Rahbeck regime (See FIG. 7). The current invention allows for the bulk resistivity of the said layer to be tuned to fall within the Johnson-Rahbeck regime at a given temperature range.

Prior art electrostatic Johnson-Rahbeck chucks using aluminum nitride materials are used for room temperature chucking applications, and are not used at higher application temperatures of 150-500° C. That is because these prior art chucks typically have polymeric or silicone adhesives that do not survive the high temperature applications.

Also in the prior art there have been high temperature Johnson-Rahbeck chucks available, such as carbon-doped pyrolitic boron nitride chucks by Advanced Ceramics Corporation (such as detailed in U.S. Pat. No. 45,748,436), or other pyrolitic boron nitride chucks doped with other materials such as silicon, as shown in U.S. Pat. No. 5,663,865 to Shin-Etsu Chemical Co. Such chucks however are cumbersome to fabricate due to the strict control of the dopant levels in the pyrolitic boron nitride.

In addition, some heated electrostatic chucks have been disclosed where a bulk sintered ceramic substrate is used with a heating element embedded in the core. The temperature of these types of substrates however cannot be ramped very quickly, because the embedded electrode acts as a defect from which cracks can initiate when thermally ramping at substantially high rates (e.g. >10° C./min). Heated substrates with a layered electrode on a surface of the substrate do not suffer from this limitation and ramp rates well over 20° C./min (up to 300° C./min) have been measured.

An important property of a film coating on the outer surface of a wafer processing apparatus is its resistance to corrosion when exposed to halogen plasma environments. Due to its high resistance to corrosion when exposed to halogen plasma environments, aluminum nitride has become the state-of-the-art material for fabrication of high-temperature wafer processing supports.

Typical resistivity values for AlN films range from $10^{11}$ to $10^{14}$ ohm-cm and drop by approximately a factor of 20 per 100° C. temperature increase. Thus, in high-temperature applications the resistivity of these AlN films drops sufficiently low to allow excessive leakage current between high and low electrical potential segments of the electrode path, or between the heating electrode and any electrically conductive films deposited onto the AlN during wafer processing, or between the electrode and the wafer itself. This leakage current limits the useful temperature range of a wafer heating apparatus. The AlN film can be replaced by materials with higher electrical resistivity, however, the resistance to halogen plasma may be diminished. As processing temperatures creep higher, there is a need for films with higher resistivity than AlN, which still maintain the excellent corrosion resistance. The current invention provides a method of modifying the bulk resistivity of a film coating while maintaining the excellent corrosion resistant properties of typical AlN films, thus allowing higher useful operating temperatures. It uses a film coating having different regions of differing resistivities. Thus, the bulk resistivity of a film at a given temperature can be modified by simply changing the relative amount of each region present in the film, without having to formulate new film materials to produce chucks having different bulk resistivities at a certain temperature.

The heaters, electrostatic Johnson-Rahbeck chucks, and wafer carriers of the present embodiments meet the needs of maintaining a desired bulk resistivity at high temperatures, are relatively easy to fabricate, are capable of being thermally ramped at substantially high thermal ramp rates, and furthermore, where electrostatic chucking is desired, provide clamping at high power at relatively low voltages.

BRIEF SUMMARY

In one aspect, there is provided a wafer carrier including a body, the body including a substrate and an electrode element mounted on the substrate, the article further having an outer coating comprising dielectric material encasing the body, the outer coating having at least two regions of different electrical resistivity.

In a second aspect, there is provided an electrostatic chuck including a body, a chuck electrode deposited on the body, and an outer coating deposited over the chuck electrode, the outer coating including a plurality of layers having different resistivities, the outer coating comprising an outer layer comprising AlN.

In a third aspect, there is provided a method of forming a wafer carrier, the method including the steps of a) providing a base substrate, b) positioning an electrode on the base substrate, c) depositing an outer coating over the base substrate and electrode, wherein the step comprises depositing a plurality of materials having different resistivities, wherein the overall bulk resistivity of the outer coating at a given temperature can be controlled by modifying the relative amount of each of the materials deposited.

DETAILED DESCRIPTION

As used herein and in the claims, the term "adjacent" includes both direct contact and lying near, as where an intervening layer exists between two layers or objects, or alongside of another layer or object. As used herein, the term "wafer carrier" may be used to denote a heater, an electrostatic chuck, or a combined heater/electrostatic chuck.

As used herein, the term "circuit" may be used interchangeably with "electrode," and the term "heating element" may be used interchangeably with "heating electrode," "electrode," "resistor," "heating resistor," or "heater." The term "circuit" may be used in either the single or plural form, denoting that at least one unit is present. The term "circuit" may be used interchangeably with "electrode," and the term "electrode" may be used to denote either the single or plural form, denoting that at least one unit is present. The term "heating element" may be used interchangeably with "heating electrode," "resistor," "heating resistor," or "heater."

The present embodiments concern a coated article for supporting a wafer in a process chamber. The coated article may be a heater, electrostatic chuck, wafer carrier, or similar article. In each case the article has a body containing a base substrate and an electrode element deposited thereon, and also has an adjacent outer coating of dielectric material, such as aluminum nitride, which may be provided by chemical vapor deposition or other means (such as reactive physical vapor deposition, plasma spray, plasma-enhanced cvd, metal-organic cvd, photo-enhanced cvd). The outer coating has a plurality of zones or regions of differing electrical resistivity. The thicknesses or relative size of the different regions determines the overall bulk electrical resistivity of the coating.

Figure 1:
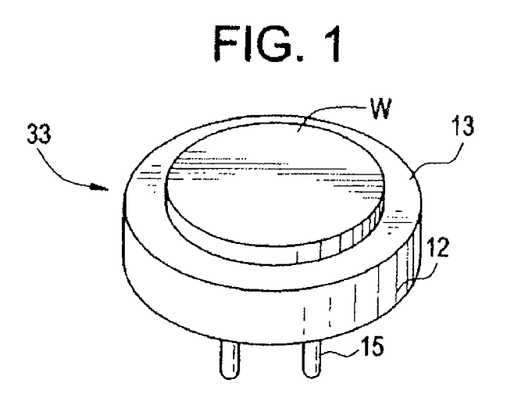
FIG. 1 is perspective view of a wafer carrier according to one of the present embodiments.

Referring now in greater detail to the drawings, wherein the showings are for the purposes of illustrating preferred embodiments of the subject novel concept only, and not for the purpose of limiting the same, FIG. 1 illustrates a wafer carrier 33 comprising a disk-shaped metallic, graphite or ceramic body 12 having an electrode disposed therein or thereon (not shown), and whose top surface 13 serves as a supporting surface for a substrate, e.g., a wafer W having a typical diameter of, e.g., 300 mm. In one embodiment, the top surface 13 is made of a high degree of flatness (within 0.05 mm surface variation) to further enhance the temperature control of the wafer W. Electric terminals 15 for supplying electricity to the wafer carrier can be attached at the center of the bottom surface of the body 12, or in one embodiment, at the sides of the body 12.

In the wafer carrier, one or more electrodes can be employed. Depending on the application, these electrodes may each function as a resistive heating element, an electromagnetic shielding electrode, a plasma-generating electrode, an electrostatic chuck electrode, or an electron-beam electrode. In one embodiment, two different electrodes are present, one acting as a heating element and the second as an electrostatic chuck electrode. The electrode(s) may be located within or on the base substrate of the wafer carrier toward the top (near the wafer substrate) or the bottom (away from the wafer substrate). A bottom location for the heating electrode may help diffuse localized heat generated by a pattern of the electrode and assist in the heat distribution to the wafer substrate.

In one embodiment, the electrode is in the form of a film electrode and formed by processes known in the art including screen-printing, spin coating, plasma spray, thermal spray, spray pyrolysis, reactive spray deposition, sol-gel deposition, combustion torch, electric arc deposition, ion plating, physical vapor deposition, sputtering deposition, laser ablation, thermal evaporation, electroplating, and laser surface alloying. In one embodiment, the film electrode comprises a metal having a high melting point, e.g., iron, nickel, tungsten, tantalum, molybdenum, rhenium, and platinum or alloys thereof.

In another embodiment, the film electrode comprises at least one of carbides or oxides of hafnium, zirconium, cerium, and mixtures thereof.

In another embodiment, an electrode is in the form an elongated continuous strip of pyrolytic graphite. Pyrolytic graphite ("PG") is first deposited onto the base substrate of the wafer carrier, via processes known in the art such as chemical vapor deposition. The PG is then is machined into a pre-determined pattern, e.g., a spiral, a serpentine, etc. The forming of the electrical pattern of the heating zones, i.e., an electrically isolated, resistive heater path, may be done by techniques known in the art, including but not limited to micro machining, micro-brading, laser cutting, chemical etching, or e-beam etching.

The construction and composition of the body 12 of the wafer carrier in the above embodiment can vary depending on the needs and properties required in the end product. In one embodiment, the base substrate of the body can be constructed of a bulk insulating material, such as ceramic. In another embodiment, the base substrate can be made from a electrically conducting material that is then coated with an insulating layer.

Figure 2A:
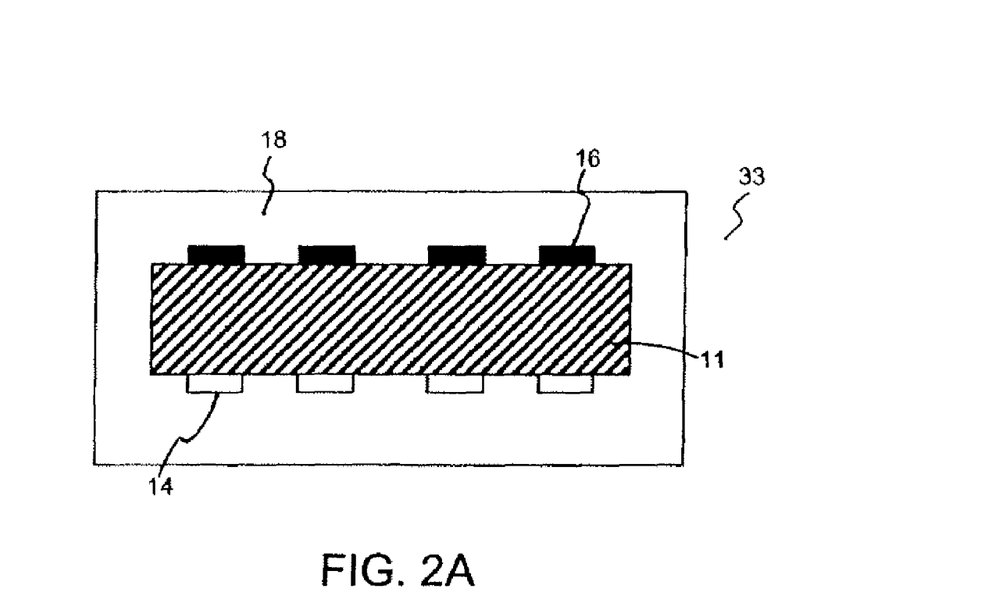
FIGS. 2A and 2B are cross-sectional views of a wafer carrier with an electrically insulating base substrate body.
Figure 2B:
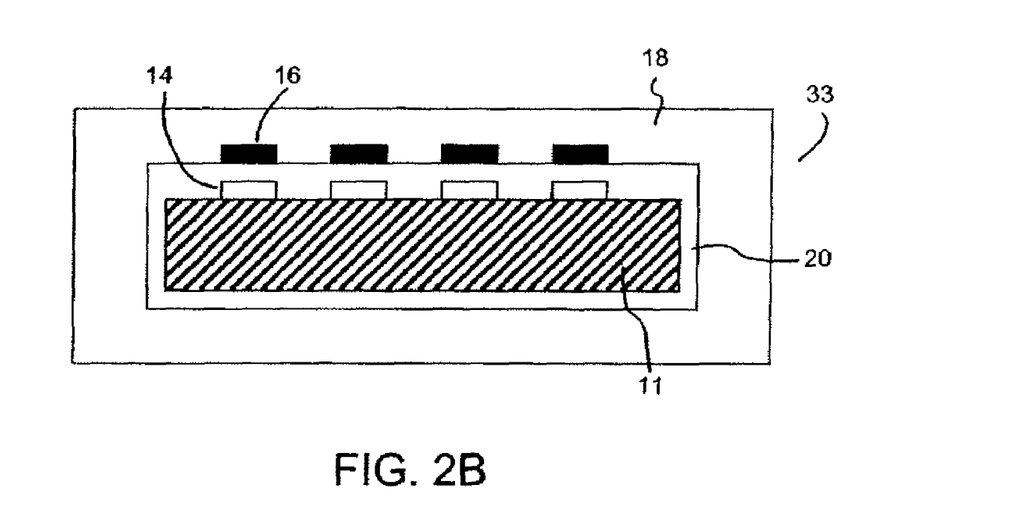

Ceramic Core Wafer Carrier: An embodiment of a wafer carrier with a body 12 having a ceramic core is illustrated with reference to a ceramic core heater as shown in FIGS. 2A-2B. In a wafer carrier 33 having a ceramic core, the base substrate 11 of the body may comprise an electrically insulating material (e.g., a sintered substrate) that may be selected from the group including oxides, nitrides, carbides, carbonitrides, and oxynitrides of elements selected from a group consisting of B, Al, Hf, Si, Ga, Y. refractory hard metals, transition metals; and combinations thereof. The base substrate 11 may be characterized as having high wear resistance and high heat resistance properties. In one embodiment, the base substrate comprises AlN of >99% purity and up to 5% of a sintering agent selected from $Y_2O_3$, $Er_2O_3$, and combinations thereof. In another embodiment, the base substrate comprises pyrolytic boron nitride (pBN).

Alternatively, a pBN base substrate can be substituted by (1) a pBN-coated graphite plate (the graphite plate being about 0.10-0.75 inches thick, optionally 0.12-0.50 inches thick, the pBN coating being about 0.005-0.035 inches, more preferably about 0.015-0.020 inches thick), (2) a hot-pressed boron nitride (BN) plate about 0.10-0.75 inches, more preferably about 0.25-0.50 inches thick, or (3) a pBN-coated hot-pressed BN plate (the hot-pressed BN plate being about 0.10-0.75 inches, more preferably about 0.25-0.50 inches thick, the PBN coating being about 0.005-0.035 inches, more preferably about 0.01-0.02 inches thick).

In one embodiment, a heating electrode 14 having an optimized circuit design is formed on or embedded within the ceramic base substrate 11. The electrode 14 may comprise a material selected from the group of iron, nickel, tungsten, tantalum, molybdenum, rhenium and platinum or alloys thereof; carbides and nitrides of metals belonging to Groups IVa, Va and VIa of the Periodic Table; carbides or oxides of hafnium, zirconium, and cerium, and combinations thereof. In another embodiment, the electrode 14 may comprise a pyrolytic graphite (PG) or thermal pyrolytic graphite (TPG). In one embodiment, the electrode 14 comprises a material having a coefficient of thermal expansion (CTE) that closely matches the CTE of the base substrate 11. By closely matching CTEs, it means one material having a CTE ranging from 0.75 to 1.25 the CTE of the base substrate. By closely matching the CTEs of the electrode and base substrate, this allows uniform repeated heating and cooling of the device without cracking or compromising the integrity of the device.

Alternatively or in addition to a heater, the wafer carrier can also function as an electrostatic chuck. In this embodiment, a chuck electrode 16, e.g., a conductive layer such as formed from the materials above, a metallized film or a TPG electrode, is formed on the base substrate 11 using fabrication methods known in the art. For the design, construction, and operation of an electrostatic chuck, see U.S. Pat. Nos. 5,591,269; 5,566,043; 5,663,865; 5,606,484; 5,155,652; 5,665,260; 5,909,355; and 5,693,581, the entire contents of which are incorporated herein by reference.

The base substrate 11 and electrode(s) are coated with an overcoat 20 comprising AlN that is electrically insulating and comprising a plurality of zones or regions of differing electrical resistivities. In one embodiment, there is an optional tie-layer (not shown) to help enhance the adhesion between the overcoat layer 20 and the base substrate 11.

In one embodiment, as shown in FIG. 2A, the heater electrode 14 is disposed on a bottom surface of the base substrate (away from the wafer substrate) to more easily spatially distribute and regulate heat in the wafer carrier. In another embodiment, both the heater electrode 14 and the chucking electrode 16 are disposed on the top of the base substrate. In such an instance, a separate insulating layer 20 can be coated onto the base substrate and heater electrode prior to placement of the chucking electrode. This insulating layer can be formed of the same material as the base substrate, the overcoat, or a different material.

Electrically Conductive Core Wafer Carrier: References are made to FIGS. 3A-3B for an embodiment of a wafer carrier having an electrically conductive base substrate 111 such as one with a graphite base substrate. Although graphite is denoted as comprising the base substrate, depending on the application, other electrically conductive materials may be used, including but not limited to graphite; refractory metals such as W and Mo, transition metals, rare earth metals and alloys; oxides and carbides of hafnium, zirconium, and cerium, and mixtures thereof. The base substrate 111 is coated with an insulating layer 130 that is electrically insulating, and optionally a tie-layer (not shown) to help enhance the adhesion between the insulating layer 130 and the base substrate 111.

Figure 3A:
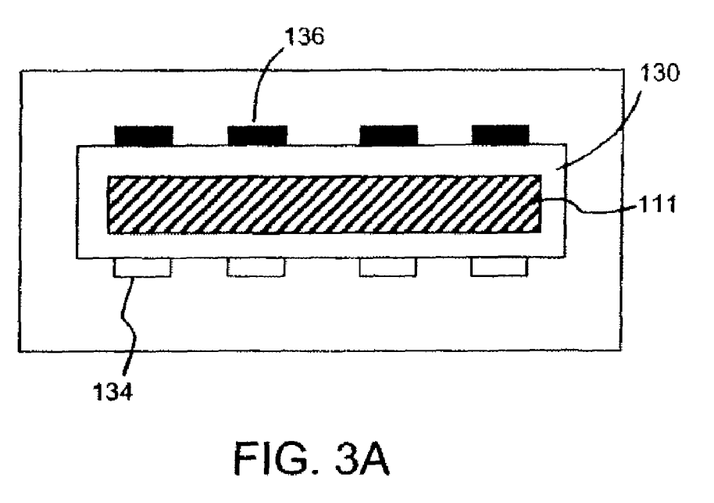
FIGS. 3A and 3B are cross-sectional views of a wafer carrier with an electrically conducting base substrate body.
Figure 3B:
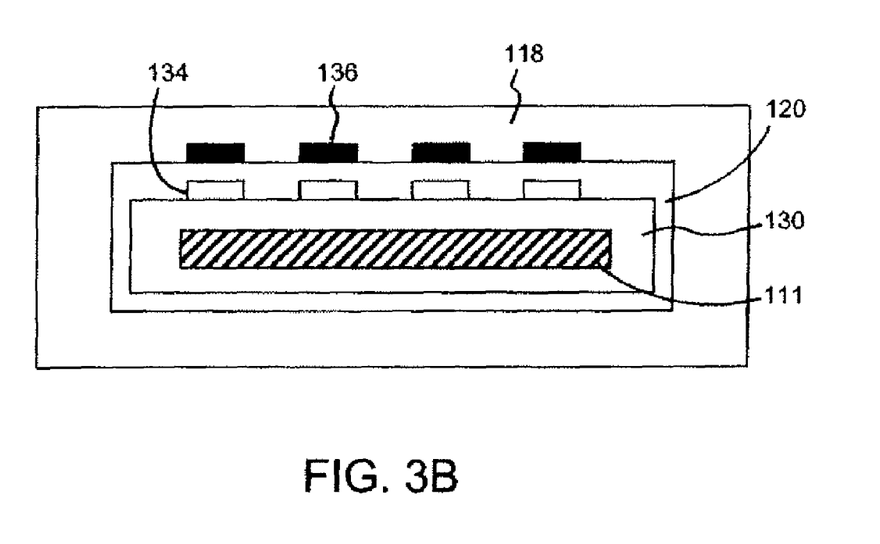

With respect to the insulating layer 130, the layer may comprise at least one of an oxide, nitride, carbide, carbonitride or oxynitride of elements selected from a group consisting of Hf, B, Al, Si, Ga, Y, refractory hard metals, transition metals; oxide, oxynitride of aluminum; and combinations thereof. An example is pyrolytic boron nitride (pBN). With respect to the optional tie-layer, the layer may comprise at least one of: a nitride, carbide, carbonitride, boride, oxide, oxynitride of elements selected from Al, Si, refractory metals including Ta, W, Mo, transition metals including titanium, chromium, iron; and mixtures thereof. Examples include TiC, TaC, SiC, MoC, and mixtures thereof.

Deposited on the insulating layer 130 are one or more electrodes 134, 136. These electrodes may be similar in construction and function as heating 134 and chuck 136 electrodes, as in the embodiments described above. In one embodiment, as shown in FIG. 3A, the two electrodes 134, 136 are on opposite sides of the base substrate. In another, they are on the same side, with an insulating layer 120 disposed between.

In one embodiment, either or both of the electrodes comprise a film electrode having a thickness ranging from 5-1000 µm, which is formed on an electrically insulating layer (either 130 or 120 depending on the embodiment) by processes known in the art. In one embodiment, the film electrode comprises a metal having a high melting point, e.g., iron, nickel, tantalum, tungsten, molybdenum, rhenium and platinum or alloys thereof. In another embodiment, the film electrode comprises at least one of carbides or oxides of hafnium, zirconium, cerium, and mixtures thereof. In one example, an electrolytic copper foil having a film thickness of 18 µm is used as electrodeThe base substrate and heater are then further coated with an etch resistant overcoat 118, that encases the base substrate and heater and forms a barrier between these elements and an operating atmosphere.

With respect to the optional tie-layer, the layer may comprise at least one of: a nitride, carbide, carbonitride, boride, oxide, oxynitride of elements selected from Al, Si, refractory metals including Ta, W, Mo, transition metals including titanium, chromium, iron; and mixtures thereof. Examples include TiC, TaC, SiC, MoC, and mixtures thereof.

Figure 4:
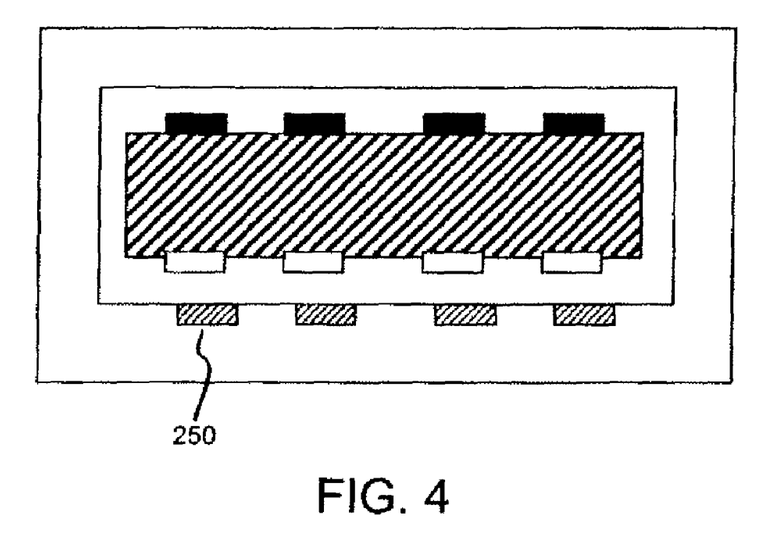
FIG. 4 is a cross-sectional view of a wafer carrier according to another embodiment.
Figure 5:
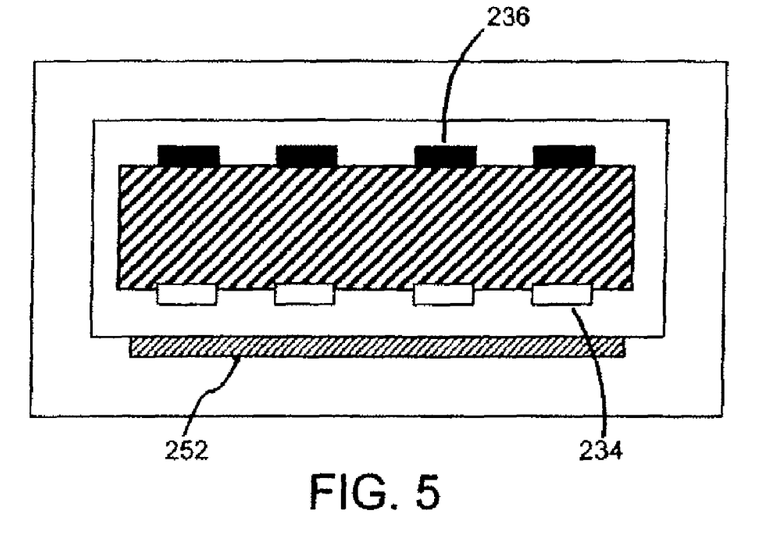
FIG. 5 is a cross-sectional view of a wafer carrier according to still another embodiment.

In other embodiments, the wafer carrier can also contain a thermistor or thermocouple 250, as shown in FIG. 4, and/or an electro-magnetic shield 252, as shown in FIG. 5. The electro-magnetic shield can function to eliminate the electrical interference between the chucking electrode 236 and the heating elements 234, or between the heating elements and the wafer.

With respect to the overcoat (18 and 118 in the embodiments above), the overcoat comprises one or more regions or layers having different volume resistivities. In one embodiment, the overcoat comprises at least two different materials selected from the group including: an oxide, nitride, carbide, carbonitride or oxynitride of elements selected from a group consisting of Hf, B, Al, Si, Ga, Y, refractory hard metals, transition metals; oxide, oxynitride of aluminum; and combinations thereof; a high thermal stability zirconium phosphate having an NZP structure of $NaZr_2(PO_4)_3$; a glass-ceramic composition containing at least one element selected from the group consisting of elements of the group $2a$, group $3a$ and group $4a$; a $BaO—Al_2O_3—B_2O_3—SiO_2$ glass; and a mixture of $SiO_2$ and a plasma-resistant material comprising an oxide of Y, Sc, La, Ce, Gd, Eu, Dy, or the like, or a fluoride of one of these metals, or yttrium-aluminum-garnet (YAG); and combinations thereof. Preferably, the overcoat comprises AlN and has two or more regions or zones, each region or zone being made from materials having different volume resistivities of from $10^6$ to $10^{15}$ ohm-cm at 25° C.

Figure 6:
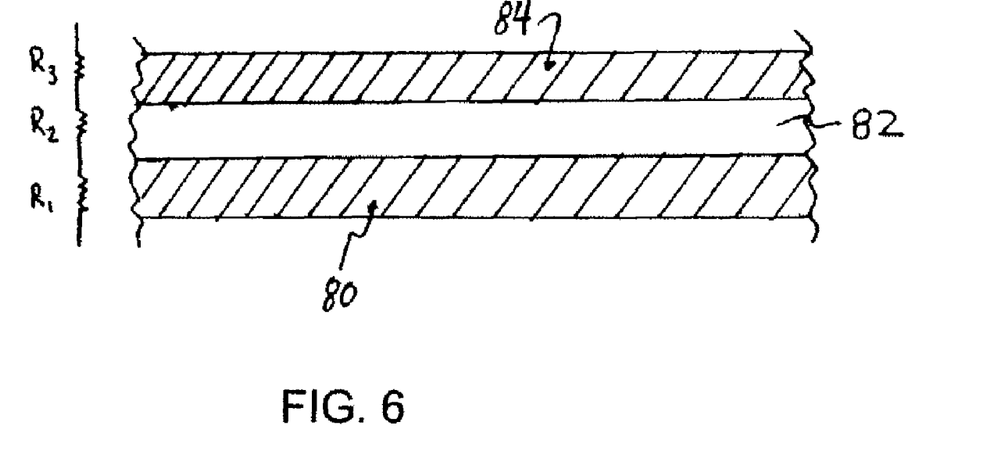
FIG. 6 is a cross-section of one embodiment of an overcoat of the present invention having different layers of different resistivities.

In one embodiment, as shown in FIG. 6, the two or more regions having different volume resistivities comprise layers 80, 82, 84, each of the layers being made from a material having different resistivity values, $R_1$, $R_2$, and $R_3$, wherein $R_1$, $R_2$, and $R_3$ are simply the specific resistance (resistivity) of the material in the layer times the layer thickness, L. The total bulk resistivity of the coating is thus $RT=R_1+R_2+R_3$, since:

$$\rho = \text{resistivity} = (R \times A)/L$$

$$(\rho \times L)/A = R, \text{ and}$$

$$R_T = (\rho_T \times L_T)/A = (\rho \times L_1)/A + (\rho_2 \times L_2)/A + \ldots (\rho_n \times L_n)/A$$

$$R_T = (\rho_T \times L_T) = (\rho_1 \times L_1) + (\rho_2 \times L_2) + \ldots (\rho_n \times L_n)$$

For purposes of discussion, layer 80 is considered to be the layer adjacent the wafer carrier body or electrodes while layer 84 is considered to be the outer layer in contact with the wafer processing chamber environment. Although the embodiment shown in FIG. 6 has three different layers, the number of layers in the invention is not so limited and can be any number greater than or equal to two. However, it should be recognized that production cost and complexity generally increases as the number of layers increases.

Depending on their composition and method of deposition, the various layers can have relatively fine, distinct dividing lines between them, or they can be diffuse or graded, with significant interpenetration of each layer into the other and no apparent demarcation line between them.

The layers can each comprise AlN, or other materials having similar CTE's. However, it is preferred for the outermost layer 84 to comprise AlN, due to its excellent resistance to corrosion in wafer processing environments. In one embodiment, each of the layers comprise a material that includes AlN, wherein the volume resistivity of the AlN in each of the layers is different. By using materials with different volume resistivities in the different layers and by independently controlling the thickness of each layer, a coating can be made having a desired bulk resistance within the Johnson-Rahbeck regime at the contemplated operating temperature of the wafer carrier and still having an AlN outer layer exhibiting excellent corrosion resistance.

There are various methods by which the resistivity of AlN can be changed. This include without limitation 1) changing the density of AlN by the inclusion of various defects or pores in the bulk material, or through other methods, 2) changing the stoichiometry of the material by changing the Al to N ratio in the material, 3) introducing impurities or dopants such as oxygen or carbon into the AlN material, 4) changing or altering the AlN crystal orientation, crystal structure or crystal size, and 5) changing the number of pores, pore size, pore shape, or pore location in the AlN layer. Methods 4) and 5) above can be considered as changing the microstructure of the AlN.

Methods of modifying the density, crystal structure, stoichiometry, impurity composition, and defects include varying the conditions under which the AlN is deposited, such as varying temperatures, pressures, precursor concentrations, gas flow rates, plasma energy densities, and substrate surface conditions, and other variations to process conditions.

Thus, in one embodiment, the overcoating comprises three layers, wherein the top and bottom layer comprise AlN having a volume resistivity of about $10^5$ ohm-cm at 600° C. The middle layer comprises a blend of AlN and $Al_2O_3$ having a lower volume resistivity, e.g. about $10^{10}$ ohm-cm at 600° C. In one embodiment, the entire thickness of the coating may be from about 5 um-1000 um. The thicknesses of the individual layers may be from 1 um-999 um. The preferred entire thickness is from about 25 um-500 um, and the preferred thickness of individual layers is from about 5 um-495 um.

In other embodiments, the coating may include 1) regions wherein the region adjacent the electrode is aluminum nitride and at least one region not in contact with the electrode comprises aluminum oxynitride, 2) a region adjacent the electrode has at least 25% lower electrical resistivity as compared to the bulk coating and at least one region not adjacent with the electrode has at least 25% higher electrical resistivity as compared to the bulk resisitivity of the coating, 3) a region adjacent the electrode comprising aluminum nitride comprising less than 0.6 wt % oxygen and at least one zone not adjacent the electrode is aluminum nitride comprising greater than 0.6 wt % oxygen, 4) a region adjacent the electrode comprising aluminum nitride having a 25° C. electrical resistivity between $10^3$ and $10^{14}$ ohm-cm and at least one zone not adjacent the electrode having a 25° C. electrical resistivity greater than the first region and between $10^9$ and $10^{15}$ ohm-cm.

A wafer carrier according to the invention is used in the processing of silicon wafers. Part of this processing involves layering of materials on the wafer by chemical vapor deposition, the wafer carrier is also subject to being coated with the materials during the processing. It becomes periodically necessary to clean the wafer carrier. The process of layering materials on the wafer is generally not damaging to the wafer carrier. However, harsh cleaning compositions such as $NF_3$ plasma are often used to clean the surface of these articles. This cleaning is typically undertaken after 30 to 40 process hours, or hours spent processing wafers. The wafer carrier is then typically subjected to plasma cleaning for 1-2 cleaning hours or less. A wafer carrier coated only with PBN is typically damaged sufficiently to require replacement after exposure to $NF_3$ plasma for 50 to 100 cleaning hours. CVD-AlN coating is considerably more resistant to attack by $NF_3$ plasma than a PBN coating, and in testing has shown no detectable damage after 12-24 cleaning hours. A wafer carrier according to the invention preferably has sufficient CVD-AlN coating to effectively survive, that is, to maintain the article in a protected condition such that the coated article does not need to be replaced, for at least 10, 25, 50, 100, 200, 300, 400, 500, 600, 700, 800, 900, 1000, 1500, 2000, 3000, or 4000 cleaning hours, that is, hours of $NF_3$ plasma attack during cleaning of the article. To achieve this, outer coating 18, 118 preferably comprises CVD-AlN and is about 5-1000 microns, more preferably about 25-500 microns.

The process of applying a CVD-AlN coating is known; see, for example, U.S. Pat. Nos. 4,950,558; 5,672,420; 4,239,819; 5,178,911; 4,172,754; and 5,356,608, the contents of which are incorporated by reference. In summary, the vapor deposition process is performed in a reactor having a chlorination chamber in communication with a deposition chamber. The deposition chamber is contained within a vacuum chamber, which is connected to one or more vacuum pumps. Before beginning the process, the coating substrate is placed in the deposition chamber and the chlorination chamber is loaded with a bed of aluminum particles. The vacuum chamber and deposition chamber are then evacuated.

To begin the process, the chlorination chamber is heated to a temperature between 200 and 400° C. by resistive heating elements. Chlorine ($Cl_2$) and nitrogen ($N_2$) gas are introduced into the chlorination chamber. At this temperature the aluminum and chlorine form aluminum chloride gas.

The aluminum chloride then passes into deposition chamber, which had previously been evacuated to a low pressure of about 1 to 10 torr, preferably about 2 torr. Ammonia ($NH_3$) and hydrogen ($H_2$) are also introduced into the deposition chamber. The temperature is maintained at 600 to 1100° C., by heaters. The wafer carrier substrate is then coated with AlN as the aluminum chloride and ammonia react to form AlN.

The AlN coating builds up on the wafer carrier substrate at a rate ranging from about 10 to 20 micrometers per hour. The aluminum nitride coating resulting from chemical vapor deposition is superior to that resulting from sintering or hot-pressing, as it is very dense and highly pure, and has an essentially uniform thickness. Coatings prepared as described above exhibit density from 85 to 97 percent of the theoretical crystalline density of aluminum nitride. (Theoretical AlN crystalline density=3.26 g/cc). Other CVD-AlN coating processes are known in the art using other techniques and materials, all of which art is incorporated herein by reference.

Figure 7:
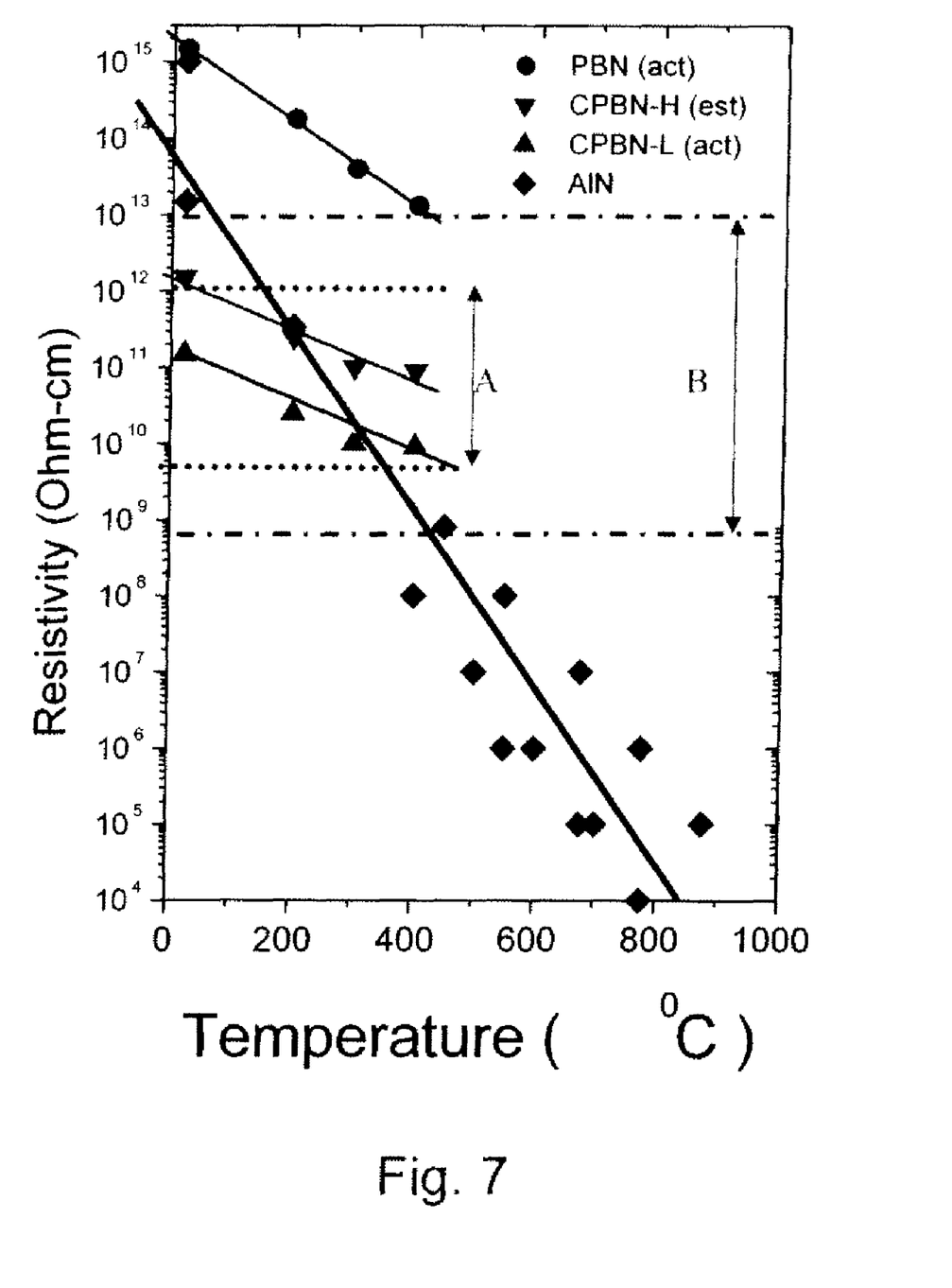
FIG. 7 is a graph showing the volume resistivities for various materials along a temperature spectrum.

Data to support that the invention works as described is shown in FIG. 7, which shows that the resistivity of CVD deposited Aluminum Nitride coatings are in the Johnson-Rahbeck regime and comparable to resistivity of carbon-doped pyrolitic boron nitride materials (CPBN). The region designated A is the Johnson-Rahbeck regime according to Tamagawa, J Vac. Sci. Japan 45 (2002). The region designated B is the Johnson-Rahbeck regime according to Kahno et al., JVSTB 21, pp 2371 (2003).

EXAMPLES

Figure 8:
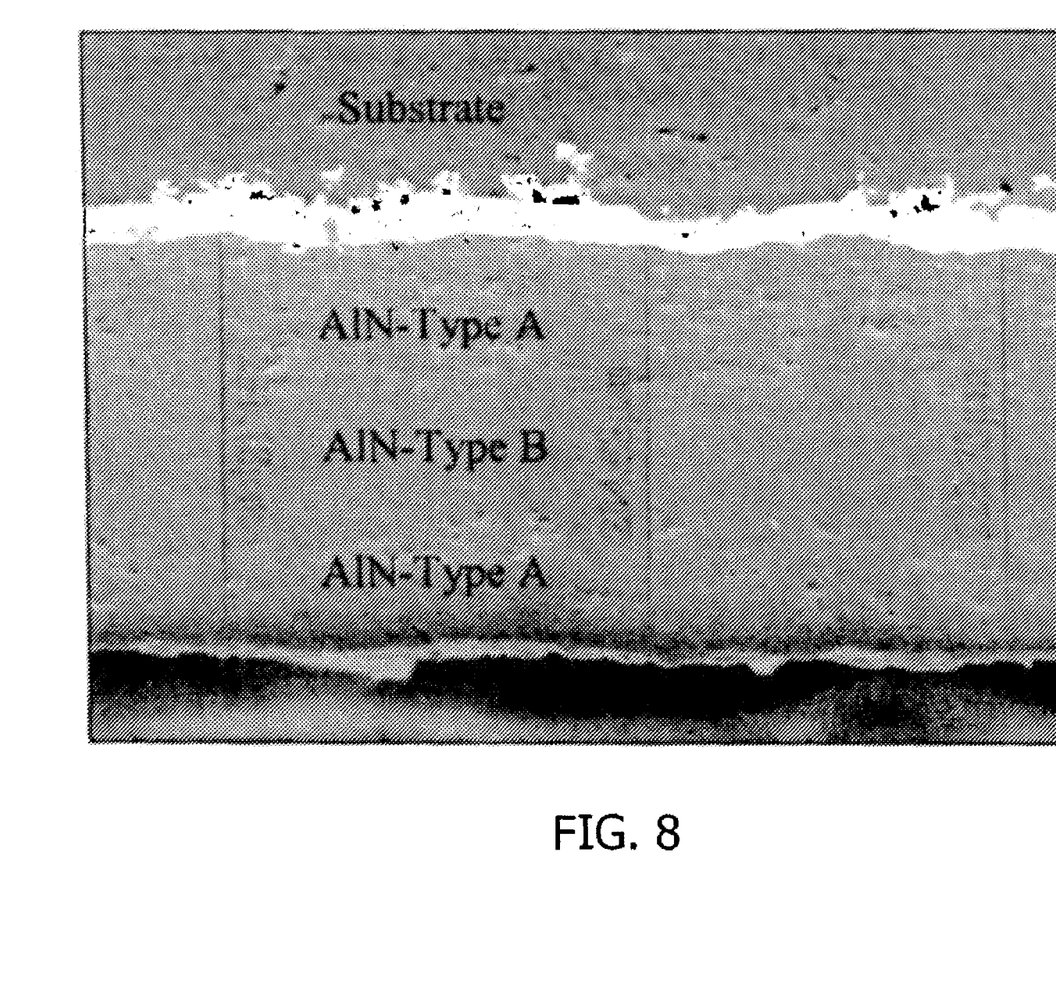
FIG. 8 is a micro-graph showing a cross section of an AlN overcoat consisting of 3 layers of two types of AlN with differing volume resistivity.

Examples of the layered AlN are shown in Table 1 and in FIG. 8. The examples utilize 3 types of AlN film with varying resistivity. Type-A AlN is a low-density, low resistivity film; Type-B AlN is a high density, mid-range resistivity film; and Type-C AlN is an ultra-high resistivity AlN film. The resistivity measured at 600 C. for each AlN type is shown in Table 1. Sample 70858 consists of 3 layers of AlN, in which layers 1 and 3 are Type-A AlN and layer 2 is Type-B AlN. In this example the composite resistivity of the tri-layer coating falls between the resistivity of the individual layers, and is tuned to $1.5 \times 10^7$ ohm-cm by controlling the thickness of the individual layers. Sample 80153 is a bi-layer structure, in which the resistivity was tuned from $1.3 \times 10^{10}$ ohm-cm, if only Type-C AlN was used, to $4.1 \times 10^9$ ohm-cm. A third example is provided showing the a tri-layer structure utilizing Type-B and Type-C AlN, in which the composite resistivity of the tri-layer structure is tuned to $6.9 \times 10^8$ ohm-cm. FIG. 8 is an SEM micro-graph showing the cross section of an AlN overcoating consisting of 3 layers of two types of AlN with differing volume resistivity.

TABLE 1

| Sample | Structure | AlN Type | Area (cm2) | thk (um) | R (ohm) | 600 C. resistivity (ohm-cm) |
|---|---|---|---|---|---|---|
| 70858 | layer 1 | Type-A | 9 | 75 | 3.67E+01 | 4.4E+04 |
| | layer 2 | Type-B | 9 | 80 | 3.91E+04 | 4.4E+07 |
| | layer 3 | Type-A | 9 | 75 | 3.67E+01 | 4.4E+04 |
| | Composite | Type-A/Type-B/Type-A | 9 | 230 | 3.92E+04 | 1.5E+07 |
| 80153 | layer 1 | Type-C | 9 | 42 | 6.07E+06 | 1.3E+10 |
| | layer 2 | Type-A | 9 | 90 | 4.40E+01 | 4.4E+04 |
| | Composite | Type-A/Type-C | 9 | 132 | 6.07E+06 | 4.1E+09 |
| Example | layer 1 | Type-B | 9 | 95 | 4.64E+04 | 4.4E+07 |
| | layer 2 | Type-C | 9 | 10 | 1.44E+06 | 1.3E+10 |
| | layer 3 | Type-B | 9 | 95 | 4.64E+04 | 4.4E+07 |
| | Composite | Type-B/Type-C/Type-B | 9 | 200 | 1.54E+06 | 6.9E+08 |

While the subject novel concept has been described with reference to the foregoing embodiments and considerable emphasis has been placed herein on the structures and structural interrelationships between the component parts of the embodiments disclosed, it will be appreciated that other embodiments can be made and that many changes can be made in the embodiments illustrated and described without departing from the principles of the subject novel concept. Obviously, modifications and alterations will occur to others upon reading and understanding the preceding detailed description. Accordingly, it is to be distinctly understood that the foregoing descriptive matter is to be interpreted merely as illustrative of the present novel concept and not as a limitation. As such, it is intended that the subject novel concept be construed as including all such modifications and alterations insofar as they come within the scope of the appended claims and any equivalents thereof.

What is claimed is:

1. A wafer carrier comprising a body, said body comprising a substrate and an electrode element, the wafer carrier further comprising an outer coating disposed on at least a portion of an outer surface of said body, said outer coating comprising dielectric material and having at least two regions of different electrical resistivity, wherein a first region adjacent said electrode comprises aluminum nitride of higher density relative to at least one other region, and a second region comprises aluminum nitride of lower density relative to at least said first region.

2. A wafer carrier according to claim 1, wherein the outer coating is about 25 to 500 micrometers thick.

3. A wafer carrier according to claim 1, wherein the relative sizes of the regions are selected to provide a desired bulk electrical resistivity to the outer coating within the Johnson-Rahbeck regime at a desired temperature of from 150 to 600° C.

4. A wafer carrier according to claim 1, wherein said regions comprise one or more layers through a thickness of the coating.

5. A wafer carrier according to claim 4, wherein a said layer adjacent said electrode comprises aluminum nitride and another layer comprises aluminum oxynitride.

6. A wafer carrier according to claim 1, wherein said first region adjacent said electrode has at least 25% lower electrical resistivity as compared to the bulk resistivity of the outer coating, and at least another region has at least 25% higher electrical resistivity as compared to the bulk resistivity of the outer coating.

7. A wafer carrier according to claim 1, wherein said first region adjacent said electrode comprises aluminum nitride comprising less than 0.6 wt % oxygen, and at least another region comprises aluminum nitride comprising greater than 0.6 wt % oxygen.

8. A wafer carrier according to claim 1, wherein said first region adjacent said electrode comprises AlN having a 25° C. electrical resistivity between $10^3$ and $10^{14}$ ohm-cm, and at least one other region has a 25° C. electrical resistivity greater than the first region and between $10^9$ and $10^{15}$ ohm-cm.

9. A wafer carrier according to claim 1, wherein said first region adjacent said electrode comprises AlN having a 600° C. electrical resistivity less than $10^{10}$ ohm-cm, and at least one other region has a 600° C. electrical resistivity of greater than $10^6$ ohm-cm.

10. A wafer carrier according to claim 1, wherein said electrode comprises pyrolytic graphite.

11. A wafer carrier according to claim 10, wherein said pyrolytic graphite electrode comprises a resistive heating element.

12. A wafer carrier according to claim 1, wherein said substrate comprises an electrically conductive material.

13. A wafer carrier according to claim 12, wherein said substrate comprises graphite.

14. A wafer carrier according to claim 12, further compromising a non-conductive layer positioned between said substrate and said electrode.

15. A wafer carrier according to claim 14, wherein said non-conductive layer comprises pyrolytic boron nitride.

16. A wafer carrier according to claim 1, wherein said substrate comprises pyrolytic boron nitride or AlN.

17. A wafer carrier according to claim 1, wherein said wafer carrier comprises first and second pyrolytic graphite elements, wherein said substrate is disposed between the two pyrolytic graphite elements.

18. A wafer carrier according to claim 17, wherein the first pyrolytic graphite element is a resistance heating element, and the second pyrolytic graphite element is a chucking electrode.

19. A wafer carrier according to claim 1, wherein said wafer carrier comprises an electrostatic chuck comprising a body, a chuck electrode deposited on said body, and an outer coating deposited over said chuck electrode, said outer coating comprising a plurality of layers having different resistivities, said outer coating comprising an outer layer comprising AlN.

20. A wafer carrier according to claim 1, wherein said regions comprise AlN, wherein AlN in a first region differs from AlN in a second region by at least one of: different density, different Al to N stoichiometry, different crystal orientation, crystal structure or crystal size, or the presence and amount of dopants in the AlN.

21. A method of forming a wafer carrier, said method comprising the steps of a) providing a base substrate, b) positioning an electrode on said base substrate, c) depositing a outer coating over said base substrate and electrode, wherein said step c) comprises depositing a plurality of regions comprising materials having different volume resistivities, wherein the overall bulk resistivity of said outer coating at a given temperature can be controlled by modifying the relative amount of each of said materials deposited.

22. A wafer carrier comprising a body, said body comprising a substrate and an electrode element, the wafer carrier further comprising an outer coating disposed on at least a portion of an outer surface of said body, said outer coating comprising dielectric material and having at least two regions of different electrical resistivity, wherein the relative sizes of the regions are selected to provide a desired bulk electrical resistivity to the outer coating within the Johnson-Rahbeck regime at a desired temperature of from 150 to 600° C.

* * * * *